United States Patent [19]
Goth

[11] Patent Number: 4,824,797
[45] Date of Patent: Apr. 25, 1989

[54] SELF-ALIGNED CHANNEL STOP

[75] Inventor: George R. Goth, Poughkeepsie, N.Y.

[73] Assignee: International Business Machines Corporation, Armonk, N.Y.

[21] Appl. No.: 793,504

[22] Filed: Oct. 31, 1985

[51] Int. Cl.$^4$ .......................................... H01L 21/265
[52] U.S. Cl. ........................................ 437/67; 437/63; 437/228; 437/225
[58] Field of Search ............ 29/576 W; 437/228, 225, 437/67, 68, 63, 16, 38

[56] References Cited
U.S. PATENT DOCUMENTS

| | | | |
|---|---|---|---|
| 4,024,564 | 5/1977 | Shimada et al. | 357/53 |
| 4,104,086 | 8/1978 | Bondur et al. | 148/1.5 |
| 4,137,109 | 1/1979 | Aiken et al. | 29/576 W |
| 4,261,763 | 4/1981 | Kumar et al. | 29/57 W |
| 4,298,881 | 11/1981 | Sakurada et al. | 357/38 |
| 4,381,953 | 5/1983 | Ho et al. | 148/1.5 |
| 4,430,663 | 2/1984 | D'Altroy et al. | 357/53 |
| 4,470,062 | 9/1984 | Muramatsu | 357/50 |
| 4,502,913 | 3/1985 | Lechaton et al. | 156/643 |
| 4,538,343 | 9/1985 | Pollack et al. | 29/576 W |

FOREIGN PATENT DOCUMENTS

| | | | |
|---|---|---|---|
| 0090111 | 10/1983 | European Pat. Off. | 29/576 W |
| 0084443 | 5/1983 | Japan | 29/576 W |
| 0153348 | 9/1983 | Japan | 29/576 W |
| 0043547 | 3/1984 | Japan | 29/576 W |
| 0111439 | 6/1985 | Japan | 29/576 W |

OTHER PUBLICATIONS

Ghandhi, S. K. "VLSI Fabrication Processes" 1983 pp. 346–353, 570, 316.
Colclaser, R. A., "Micro electronics processing and Design" 1980, pp. 152–155.

Primary Examiner—Brian E. Hearn
Assistant Examiner—Kevin McAndrews
Attorney, Agent, or Firm—Aledander Tognino; T. Rao Coca

[57] ABSTRACT

Disclosed is a process of forming channel stops which starts with a, for example, N type silicon substrate having on the surface thereof an insulator trench mask defining the region of silicon where an isolation trench is desired. A blockout layer having an opening in correspondence with the portion of the would-be silicon mesa where a channel stop is desired is formed. N type dopant is introduced into the exposed silicon followed by an anneal step to and vertically diffuse the dopant into the silicon body. The exposed silicon is etched forming a deep trench which delineates silicon mesa having at a section of the peripheral portion thereof a shallow and highly N doped region. Upon forming a pair of highly P doped regions on either side of the shallow highly N doped region, the latter functions as a channel stop to arrest charge leakage between the P doped regions due to parasitic FET action at the trench walls.

13 Claims, 3 Drawing Sheets

SELF-ALIGNED CHANNEL STOP

FIELD OF THE INVENTION

The invention relates to integrated circuits formed in a region of semiconductor body isolated by a dielectric-filled trench and, more particularly, to a channel stop provided at the trench-defined peripheral regions of the isolated body for preventing charge leakage between two closely-spaced and similarly doped regions of the body.

BACKGROUND OF THE INVENTION

In the monolithic integrated circuit technology, it is usually necessary to isolate various active and/or passive devices from one another in the integrated circuit structure. More recent trends in this technology capitalize on a particular dielectric isolation where a pattern of dielectrically filled trenches, extending from one surface of the integrated circuit to the interior thereof is used to isolate the devices. The method of manufacturing this form of dielectric isolation involves the formation of a pattern (generally in the form of a grid) of deep trenches in a monolithic silicon semiconductor wafer. An insulator liner of silicon dioxide (typically, about 0.15 $\mu$m thick) and silicon nitride (typically, about 0.08 $\mu$m thick) is then formed on the planar surfaces of the trenches. The oxide liner is used to passivate the any PN junctions that intercept the trench sidewall and the nitride liner serves as a barrier for mobile ions present in insulating layers used in semiconductor chip wiring. An organic material such as polyimide or an inorganic material such as polysilicon or silicon dioxide is then introduced into the trenches to completely fill them. The remaining portions of the monocrystalline silicon wafer are now isolated from one another by the grid of the dielectric material. Semiconductor devices and circuits can now be formed in the isolated monocrystalline silicon regions.

A representative semiconductor device structure comprised of a complementary vertical NPN and lateral PNP (LPNP) transistor formed in the trench isolated silicon region is illustrated in FIGS. 1-3 where FIG. 1 shows the top view and other two figures show cross-sectional views. In FIGS. 1-3, 10 designates the starting P-silicon wafer having an N+ subcollector region 12 and N epitaxial layer 14. A trench 16 having a liner of oxide 18 and nitride 20 and filled completely with a dielectric such as polyimide 21 delineates a central stud or mesa of silicon 22. The epitaxial layer 14 corresponding to the mesa 22, which has been designated by numeral 24, constitutes both the collector of the NPN and base of the LPNP transistors. Likewise, the P doped region 26 serves as both the base of the NPN and collector of the LPNP devices. The N doped and P doped regions 28 and 30 constitute the emitters of the NPN and LPNP transistors, respectively.

Continuing with reference to FIGS. 1-3, the N region 24, which separates the LPNP emitter 30 and NPN base 26 by a narrow (typically about 1.0 $\mu$m) width W, is typically doped to a low concentration level of approximately about $10^{16}$ atoms/cc (about two orders of magnitude lower than the concentration level of the P regions 26 and 30) to assure high performance of the complementary device. As a result of this high doping concentration and narrow width W, the localized regions 32 and 34 of the N region 24 adjacent to the sidewalls of the trench 16 are prone to inversion due to the polyimide trench-fill and the trench liner adjacent to the regions 32 and 34 acting as the gate electrode and gate insulator, respectively, of a parasitic field effect transistor (FET). The necessary gate voltage to turn on the parasitic FET is invariably sustained by the polyimide 21. Inversion of regions 32 and 34 leads to charge leakage between the LPNP emitter 30 and collector 26.

Inversion is generally most acute at the upper corner regions 32 and 34 of the silicon mesa 22 because, as indicated in FIGS. 2 and 3, the oxide-nitride liner 18-20 is invariably thinned out at the top corner regions of the trench 16 due to the geometry effects associated with sharp corners. Specifically, the trench liner at the corner regions is reduced by 50% compared to the remainder of the trench surface due to the presence of a silicon nitride layer on the mesa 22 during the trench oxide liner 18 forming step.

Leakage between the highly doped and closely spaced regions P regions 26 and 30 via either of the peripheral edges of the intermediate lightly doped N region 24 also occurs due to inherent presence of charges in the oxide-nitride liner and the polyimide trench fill. To elaborate on this point, the trench liner, particularly the thermal oxide 18 thereof, characteristically contains mobile ions such as those of sodium. Likewise, the polyimide contains negative charges in the form of free hydroxyl ions. The resultant of these various freely moving charges is build up of a sufficiently high amount of charge giving rise to the above leakage.

While the charge leakage problem has been discussed in the context of a complementary bipolar device formed on a trench-defined silicon mesa, it is not so limited. Another situation where this problem plagues semiconductor device fabrication is when the P regions 26 (without the embedded N region 28) and 30 (FIGS. 1-2) are resistor bars. Yet another situation is when the P regions 26 (absent region 28) and 30 are the source and drain, respectively of a FET with the intermediate N region being the FET gate region. In other words, the charge leakage problem occurs whenever a lightly doped narrow region of one conductivity type separates two highly doped regions of an opposite conductivity type so long as the various regions are formed on a trench isolated silicon mesa.

One way of overcoming the above charge leakage problem is to insure that the trench liner is free of any mobile ions and increase the thickness of the liner. However, formation of (oxide) trench liner free of mobile ions is extremely difficult, if not impossible. Certainly, it significantly adds to the cost of fabrication. Also, increasing the thickness of the liner to prevent parasitic FET action means a reduction of the chip area since the oxide is formed by consumption of the silicon, thereby reducing the density of devices on the wafer.

Another alternative is to provide an N+ reach-through diffusion in regions 32 and 34 extending down to the subcollector region 12 to prevent leakage between P regions 26 and 30. However, this solution has a number of disadvantages, First, since each edge of the silicon mesa 22 requires at least 1.5 $\mu$m wide real estate for accommodating the reach-through, the mesa 22 should be made at least 3 $\mu$m wider. This translates into a reduction in the wafer device density. Specifically in the case of complementary bipolar device fabrication, the above-necessitated increase in the mesa dimensions, in turn, increases the LPNP device size resulting in an increase in the integrated circuit delay due to increased collector-to-base capacitance. Also, formation of reach-through adds second and third order alignment problems to the ground rules which can result in leakage between the NPN emitter and the N+ reach-through channel stop.

Yet another solution to the P-to-P leakage problem is to increase the N dopant concentration level in the epitaxial silicon layer 24. However, by doing so not only the gain of the LPNP transistor is decreased, but also its collector-to-base capacitance will be increased, thereby rendering the LPNP device slow.

Accordingly, it is an object of the present invention to solve these and other problems by means of a straight forward and simple structure.

Specifically, it is an object of the invention to provide a structure which eliminates charge leakage between two closely-spaced, highly and similarly (i.e., both P or N) doped, and trench-defined silicon regions via the trench-defined edges of a lightly (N or P) doped intermediate region therebetween.

It is another object of the invention to provide a structure which does not encroach upon valuable chip real estate.

It is another object of the invention to provide a method of forming the above structure.

SUMMARY OF THE INVENTION

The above objects and other related objects and advantages are achieved through the use of a novel self-aligned channel stop structure herein disclosed. In one illustrated preferred embodiment of the invention, the structure includes a silicon mesa defined by a dielectric-filled trench having on the top surface region thereof a pair of highly and likely doped regions of a first conductivity type. The highly doped regions are separated from each other by a relatively lightly doped region of a second conductivity type of width W. All the three doped regions have at least one end which butts against a common wall of the trench. The structure is provided with a highly doped channel stop of the second conductivity type at the top corner of the mesa corresponding to the lightly doped region to prevent charge leakage between the two highly doped regions via the intermediate lightly doped region. The channel stop is self-aligned to the trench sidewall, narrow (typically about 0.1 to 0.5 μm) and is of a depth relatively small compared to those of the other doped regions.

In accordance with a more specific structural aspect of the invention, the highly doped regions constitute resistor bars formed in a lightly doped epitaxial silicon layer of an opposite conductivity type to that of the bars. In another embodiment, one highly doped region constitutes both the base of an NPN transistor and collector of an LPNP device, the other highly doped region constitutes the emitter of the PNP transistor and the lightly doped region constitutes both the base of the LPNP device and collector of the NPN device. In this embodiment, the emitter of the NPN transistor is embedded within the NPN base region. In another embodiment, the two highly doped regions constitute the source and drain, respectively, of a FET with the intermediate lightly doped region constituting the FET gate region.

In accordance with the method of forming a self-aligned channel stop of the invention, the method starts with a first conductivity type monocrystalline silicon substrate covered with an insulator layer. An opening is formed in the insulator layer selectively exposing the silicon surface in accordance with the desired shape of the isolation trench region (or the silicon mesa). Next, a blockout mask having an opening in correspondence with the portion of the peripheral region of the would-be silicon mesa where a channel stop is desired is formed. Dopant of the first conductivity type is then introduced into the silicon exposed by the combination of openings in the blockout mask and the insulator layer, for example, by ion implantation obtaining a high dopant concentration level therein. Thereafter, by thermal anneal the dopant is caused to and vertically diffuse into the silicon body. The exposed silicon is anisotropically etched to form a deep trench which delineates a silicon mesa having at the top corner thereof a narrow and shallow doped region. This doped region functions as a channel stop between a pair of highly doped second conductivity type regions that are formed subsequently in the silicon mesa on either side thereof.

BRIEF DESCRIPTION OF THE DRAWINGS

The novel features, elements and process steps and their combination characteristic of the invention are set forth in the appended claims. The invention itself, however, will be best understood by reference to the detailed description which follows in conjunction with the accompanying drawings, wherein:

DETAILED DESCRIPTION OF THE PREFERRED EMBODIMENTS

Figure 1:
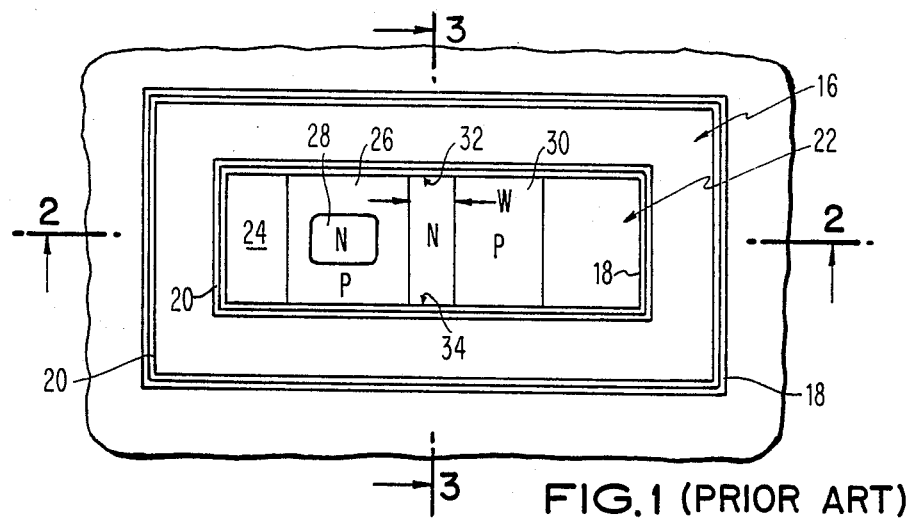
FIG. 1 is a plan view of a prior art trench-isolated silicon mesa containing a complementary vertical NPN and lateral PNP transistor pair.
Figure 2:
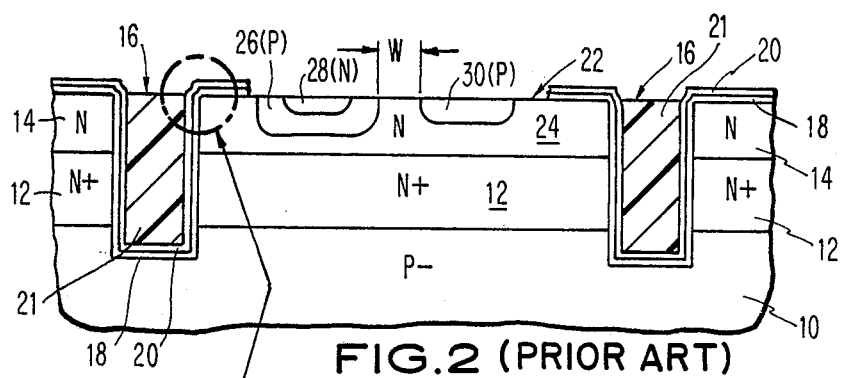
FIGS. 2 and 3 are cross-sectional representations of the structure of FIG. 1 taken along the indicated lines.
Figure 3:
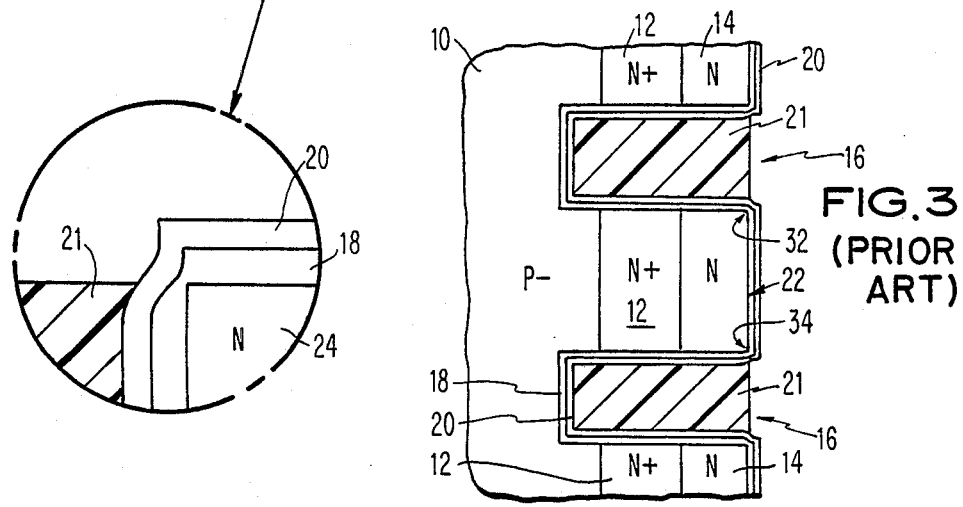
Figure 4:
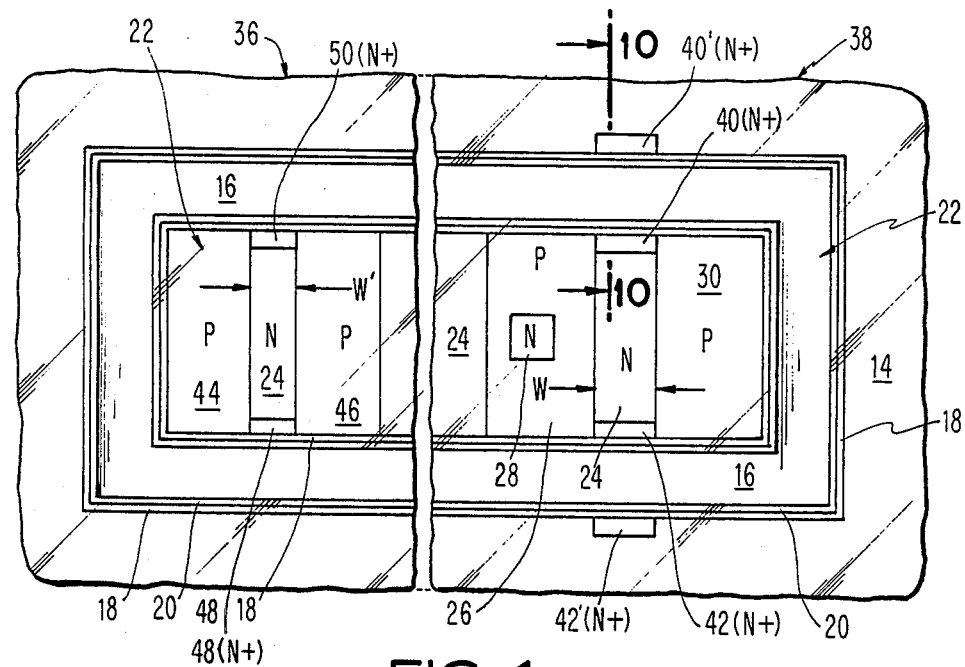
FIG. 4 is a plan view of a trench-isolated semiconductor mesa having various integrated circuit devices provided with channel stops in accordance with the present invention.

Referring to FIG. 4, there is shown in this figure a semiconductor integrated circuit structure provided with the self-aligned channel stop per the invention. The structure is fabricated from a monocrystalline silicon substrate starting material having an N type epitaxial layer 14 on the top surface thereof. The substrate is shown broken in two pieces 36 and 38 for clarity of illustration and to emphasize that multivarious semiconductor devices may be formed on a common substrate. As will be more apparent from the description hereinbelow, the piece 36 contains a side-by-side arrangement of a pair of resistors. The piece 38 contains a high performance and speed complementary vertical NPN and lateral PNP transistor pair. The complementary transistor structure shown in FIG. 4 is in every respect similar to that illustrated in FIG. 1 except that this structure additionally contains the novel self-aligned channel stop feature of the invention. To emphasize this commonality in structure, like numerals in FIGS. 1 and 4 have been used to designate like structural features.

Focusing on the complementary transistor pair contained in the semiconductor piece 38 of FIG. 4, the invention eliminates the charge leakage between the highly doped LPNP emitter 30 and the correspondingly highly doped LPNP collector (or NPN base) 26 via the the upper corner regions 32 and 34 (FIG. 1) of the lightly N doped silicon mesa 22 (i.e., the trench-defined peripheral edge portions of the LPNP base (or NPN collector) by the provision of N+ channel stops 40 and 42. The channel stops 40 and 42 are self-aligned to the trench edges and the P doped regions 26 and 30, of length identically equal to the lateral spacing W between the doped regions 26 and 30 and extend to a sufficient depth (typically, 0.5 to 1.0 μm) into the epitaxial silicon layer 14/24 to effectively prevent charge leakage along the trench sidewall portions linking the two P doped regions 26 and 30. The width dimension of the channel stops is extremely small, typically in the range 0.1-0.4 μm. Thus, the silicon area occupied by the channel stops 40 and 42 is extremely small. For effective prevention of inversion due to parasitic FET action, the dopant concentration in the N+ channel stops 40 and 42 is typically about one to two orders of magnitude higher than that in the epitaxial layer 14/24 in which the channel stops are embedded. The exact doping concentration level in the channel stop is dictated by the available threshold voltages in the integrated circuit which turn on the parasitic FETs precipitating the charge leakage. For example, for 5 volt technology, typically, the dopant concentrations in the epi layer 14/24 is about $2 \times 10^{16}$ atom/cc, the p regions 26/30 is about $5 \times 10^{18}$ atoms/cc and the N+ channel stops 40/42 is about $5 \times 10^{17} - 1 \times 10^{18}$ atoms/cc. The structure depicted in FIG. 4 contains also N+ regions 40' and 42' which are mirror images of the channel stops 40 and 42, respectively. These regions, while of no useful purpose to the device located on the silicon mesa 22, may serve the same function as the channel stops 40 and 42 for devices formed in the silicon region outside the dielectric-filled trench 16.

The advantages of this complementary device as a result of the provision of the channel stops include reduced device parasitic capacitance and reduced device size due to elimination of deep and wide prior art reach-through regions. Due to reduction in device size the device density on the chip is increased.

Turning now to the structure contained in the semiconductor piece 36 of FIG. 4, the trench-isolated silicon mesa 22 in this structure contains a pair of closely juxtaposed resistors 44 and 46. The resistors 44 and 46 are embedded in the N type epitaxial silicon layer 24 so that they are laterally separated by a distance W'. The resistors are of the P type conductivity and are generally of a high dopant concentration relative to that of the epitaxial layer 24. In order to block charge leakage between the resistors 44 and 46 via the top corner regions of the epitaxial material separating them, there are provide in accordance with the invention channel stops 48 and 50 as indicated in FIG. 4. The channel stops 48 and 50 are of N+ type and have physical and electrical characteristics in many respects similar to those of the channel stops 40 and 42 discussed hereinabove. The resistor structures provided with the channel stops per the invention are of superior quality due to the reduction in the parasitic capacitance therebetween. This resistor pair also insures the advantage of increased density of devices on the chip due to an extremely small chip area occupation by the channel stop(s).

Figure 5:
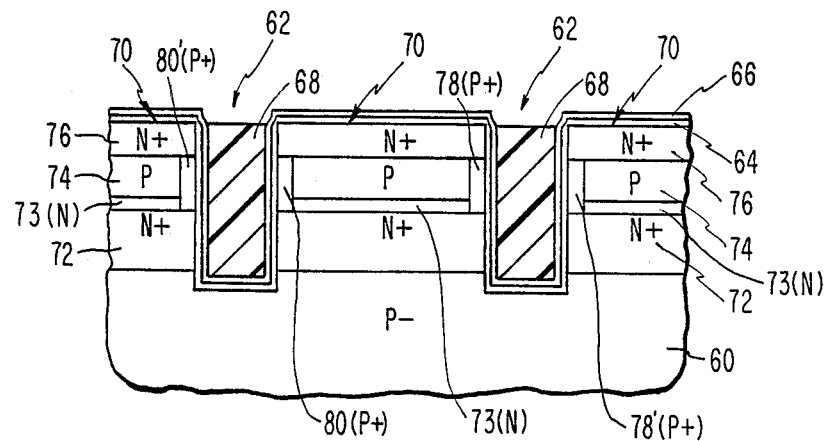
FIG. 5 is a cross-sectional representation of another structural embodiment of the invention showing the formation of a channel stop between two vertically spaced-apart regions of trench-isolated semiconductor mesa in accordance with the invention.
Figure 6:
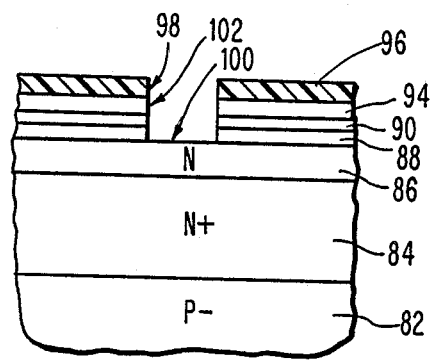
FIGS. 6–10 are flow diagrams illustrating by sequential cross-sectional representation the process of forming channel stops at selected peripheral mesa locations in accordance with the present invention.

Another structural embodiment of the invention which is illustrated in FIG. 5 pertains to the provision of vertical channel stops between two vertically separated highly doped, trench-delineated silicon mesa regions of like conductivity. In FIG. 5 the structure consists of an P—monocrystalline silicon substrate 60 having deep trenches 62 which are coated with a composite insulator of an oxide 64 and nitride 66 and filled with the dielectric 68, e.g., polyimide. The trenches 62 delineate silicon mesas 70. In the herein disclosed embodiment, each of the mesa regions 70 is provided with a highly doped N+ layer 72 deep in the mesa body directly beneath the N type epitaxial layer 73. Overlying the layer 73 is a lightly doped P region 74. Formed atop the P region 74 is a highly doped N+ region 76. A common feature of the doped regions 72-76 is that they each extend over the entire lateral dimension of the silicon mesa 70. In other words, the doped regions 72-76 abut the trench walls.

In a specific example, the regions 72, 73, 74 and 76 are the subcollector, collector, base and emitter, respectively, of a vertical NPN transistor wherein the emitter butts against the trench. Since the P doped region 74 is typically formed by boron and these atoms, due to their high segregation coefficient, deplete into the trench oxide liner during the thermal oxidation of the trench, the P dopant concentration in the region 74 along the trench-intercepting edges thereof is rendered low. This leads to charge leakage between the N+ doped regions 72 and 76 by means of establishment of a parasitic FET channel in the depleted, trench-intercepted edges of region 74. In the example given above, this translates into leakage between the NPN emitter 76 and subcollector 72 via the trench-intercepted edges of the base 74 and collector 73.

To arrest the above leakage between the vertically separated N doped regions 72 and 76 provision is made in accordance with the invention of self-aligned p+ channel stops 78 and 80. The channel stops 78 and 80 are highly doped (one to two orders of magnitude higher dopant concentration than that of regions 74), of extremely narrow dimension (0.1-0.4 μm) and fully embedded within the regions 73 and 74 so as to abut the trench sidewalls. The vertical dimension of the channel stops 78 and 80 is equal to the combined depth at the trench sidewall of the collector 73 and base 74 and the third dimension is determined by the dimension of the regions 73 and 76 which is mutually coextensive.

Referring now more particularly to FIGS. 6-10 the process of forming the self-aligned channel stops will be detailed. The semiconductor wafer or substrate 82 is composed preferably of monocrystalline silicon material and is, for example, P—monocrystalline silicon material. The P—substrate 82 has a subcollector N+ region 84 therein. An epitaxial N layer 86 is then grown on top of the substrate. These processes are standard processes in the formation of, for example, vertical NPN bipolar transistors or complementary vertical NPN and LPNP transistor pair. The substrate is typically <100> crystallographic oriented silicon having a resistance in the order of 10-20 Ohms/cm. The subcollector diffusion 84 is typically formed using arsenic having a surface concentration of about $10^{20}$ atoms/cc. The epitaxial growth process to form the layer 86 may be done by conventional techniques, such as the use of silicon tetrachloride/hydrogen or silane/hydrogen mixture at temperatures in the range of about 1000°-1200° C. During the epitaxial growth, the dopant in the N+ layer 84 moves into the epitaxial layer to complete the formation of the subcollector layer 84. The thickness of the epitaxal layer 86 for highly dense integrated circuits is of the order of 1–3 μm.

In the above description a P type substrate has been used as an example, but the type of substrate is not the crucial matter of the invention. The type of substrate may be altered to N type and the layers formed on the substrate may be of any type. The thickness of the layers specified herein may be altered as desired depending on the device design. Moreover, it is understood that the material is not limited to silicon. The process can be applied to any kind of semiconductor substrate for fabricating isolation regions between the devices formed in it.

The next series of process steps involves formation of a trench mask for defining trenches in the silicon material which dielectrically isolate one portion of the silicon from another. Briefly, the trench mask formation involves thermally oxidizing the epitaxial surface 86 in an oxygen ambient with or without water vapor atmosphere at a temperature of about 1000° C. to a thickness of about 0.2 μm of silicon dioxide 88. Silicon nitride 90 of a thickness of about 0.15 μm is deposited by chemical vapor deposition (CVD) over the oxide 88. Next, an inorganic barrier layer 94, for example, SiOx, with a thickness in the range of about 0.6–0.7 μm is deposited in a CVD plasma. This step is followed by application of a conventional photoresist 96 by spin coating. Then a window 98 is formed in the photoresist layer 96 corresponding to trench to be formed in the silicon at position 100 by exposing the photoresist to ultraviolet light through a mask (not shown) and subsequently developing in a conventional manner. It will be appreciated that the window 98 exposes the portion of the SiOx layer 94 in correspondence therewith. The exposed portion of SiOx layer 98 is then etched by anisotropic reactive ion etching (RIE) using $CF_4$ to form an opening 102 in correspondence with the opening 98. The RIE is then continued to etch off the successively exposed portions of the nitride 90 and oxide 88 thereby exposing the portion of the silicon 86 at position 100 where the isolation trench is desired. Any remaining photoresist layer 96 is then removed leaving a trench mask comprised of the multiple inorganic layers 88—90—94 having a patterned opening therein.

Figure 7:
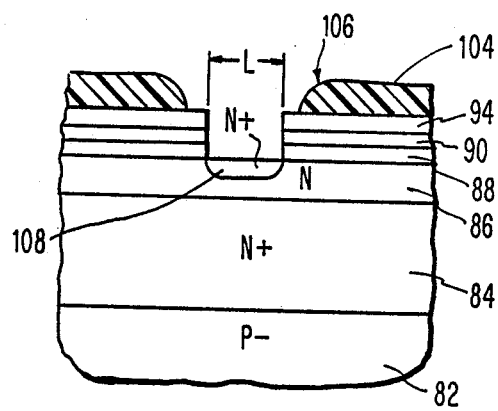

After forming the trench mask, next a thick blockout layer 104 of a photosensitive material having an opening 106 is formed as illustrated in FIG. 7. An example of the material of layer 104 is conventional photoresist. Typical thickness of the mask 104 is in the range 1–2 μm. The opening 106 in blockout layer 104 is tailored to only expose those portions of the silicon (mesa which will come into being after formation of trenches) positioned in the immediate vicinity of location 100 which are susceptible to inversion and charge leakage. One dimension of the opening 106 may be identically that of the dimension L (which is the width of the trench to be formed in the silicon). The second dimension of the opening 106 is identically equal to the channel length of the parasitic FET which causes leakage. In other words, the second dimension of opening 106 is equal to the width W or W' indicated in FIG. 4.

Next, continuing with reference to FIG. 7, using the blockout layer 104 as an implant mask, an ion implantation step is accomplished to introduce dopant of the same conductivity type as the epitaxial layer 86 into the portion of the silicon positioned at 100 which is exposed by the resultant of the openings 102 and 106 in the trench mask and blockout mask, respectively. Ion implantation may be accomplished in a single or multiple step process depending on the depth at which the channel stop is desired to be located.

If the channel stop is desired to be located in the surface region of the epitaxial layer 86, for example, analogous to the channel stops 40/42 or 48/50 indicated in the structures of FIG. 5, a single step ion implantation is preferred. In a specific example, to form N type channel stops extending to a depth of about 0.5 μm into the epi layer 86, phosphorous ions of energy approximately 30–180 Kev and dose $3-5 \times 10^{13}$ ions/sq.cm may be used. In a specific example of forming P type channel stops in the surface region of a P type silicon, boron ions of energy in the range 25–40 Kev and dose about $1-4 \times 10^{14}$ ions/sq.cm may be necessary.

On the other hand, if the channel stop is desired to be located deep in the silicon body, for example, analogous to the channel stops 78/78' and 80/80' illustrated in the structure of FIG. 5, a multiple ion implantation process is necessary. In this case the channel forming is accomplished by a plurality of ion implantation steps each involving ions of common desired conductivity type and a fixed energy and dose in specified ranges. For example, to form deep N type channel stops, phosphorous ions of a fixed energy and dose in the range 30–200 Kev and $1-8 \times 10^{13}$ ions/sq.cm, respectively, may be used. In a specific two-step ion implantation step to form deeply embedded N channel stops, initially phosphorous ions of energy about 200 Kev and dose $1.5-2.5 \times 10^{13}$ ions/sq.cm. followed by phosphorous ions of energy about one-half and dose in the same range as in the initial implantation step may be used.

Figure 8:
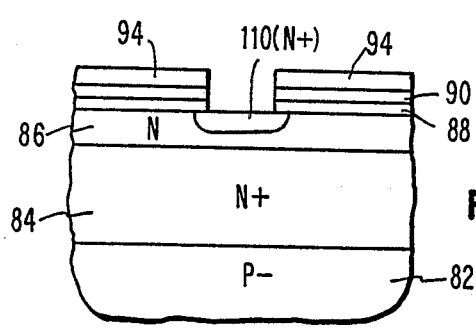

At the completion of the ion implantation step, as indicated in FIG. 7, an N type doped region is formed in the silicon exposed by the combination of the openings 106 and 102. Thereafter, the blockout mask 104 is removed by ashing using oxygen plasma. The next step in the process is annealing the implanted silicon region to cause diffusion of the implanted ions into the epitaxial layer 86 as indicated in FIG. 8. Annealing is accomplished in an inert ambient such as argon or nitrogen at a temperature in the range 800°–1000° C. for a time of approximately 0.5–1 hour. As a result of this annealing step, the N type dopant will laterally diffuse to a distance in the range 0.1–0.5 μm, accompanied by an equivalent vertical downward diffusion. This N dopant diffused region is designated by numeral 110 in FIG. 8.

Figure 9:
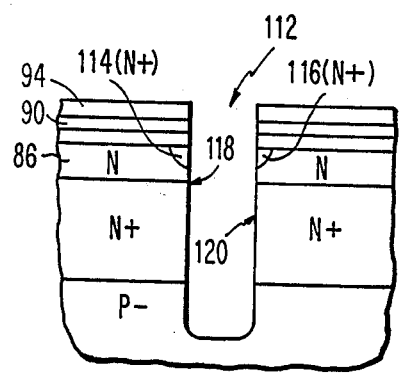

The next process step is etching of trenches in the silicon material exposed by the trench mask. One way of forming the trenches in the silicon is by RIE using a mixture of carbon tetrachloride and boron trichloride. Many well known etching techniques may be employed for the trench formation, such as illustrated in U.S. Pat. Nos. 4,104,086 issued to J. A. Bondur and H. G. Pogge, 4,381,953 to Ho et al and 4,502,913 to J. A. Lechaton, S. D. Malaviya, D. J. Schepis and G. R. Srinivasan, both of which are assigned to the present assignee. There patents are hereby incorporated by reference herein. A deep and narrow trench 112 formed by the conventional process is shown in FIG. 9. During the trench etching process the portion of the diffused region 110 which is not masked by the opening 102 in the trench mask 88—90—94 is removed while the portions of the region 110 which are masked by the trench mask are preserved in tact. These preserved remnants of dopant diffused region 110, which have been designated by numerals 114 and 116 in FIG. 9, constitute channel stops. The channel stops 114 and 116 are self-aligned not only to the trench sidewalls 118 and 120, respectively, but also to the silicon mesa structures that result from delineation by the trench pattern.

Figure 10:
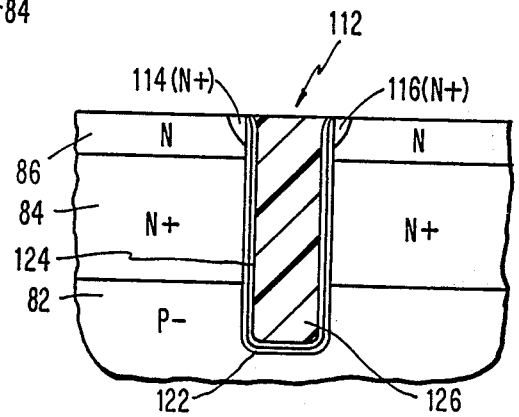

The processing at this point is substantially complete as far as the novelty of the present invention is concerned. The balance of the processing is conventionally performed. Referring to FIG. 10, this includes removal of a part or all of the trench mask, forming a silicon dioxide 122 and silicon nitride 124 coatings on the trench walls and floor and filling the trench 112 with a dielectric 126 such as polyimide. Additionally, highly and likely doped regions constituting the elements of various active or passive devices are formed on the epitaxial layer 86 on either side of each of the channel stops 114 and 116 to construct devices free of charge leakage due to parasitic transistor action at the trench sidewalls.

Thus, there has been provided in accordance with the invention, a structure and process that fully satisfy the objects and advantages set forth.

While the invention has been described in conjunction with specific preferred embodiments, it is evident that many alternatives, modifications and variations will be apparent to those skilled in the art in light of the foregoing description. For example, while the process has been described in conjunction with simultaneously forming channel stops symmetrically on the peripheral edge portions of in two adjacent silicon mesas which are separated by a trench, it can be readily modified to form a single channel stop in a given location on a single mesa. This modification entails tailoring the blockout mask 104 (FIGS. 6 and 7) such that the the opening 106 therein will not extend over the entire region 100, but will intercept this region. In this fashion only the portion of the region 100 which is intercepted by the trench mask is exposed to ion implantation while the remainder thereof is masked by the blockout mask. Subsequent annealing process causes lateral diffusion of the implanted ions only into the layer 86 intercepted by the trench mask thereby providing a channel stop in a single region of a single mesa region only.

It is therefore contemplated that the appended claims will embrace any such alternatives, modifications and variations as fall within the true scope and spirit of the invention.

What is claimed is:

1. A method for forming a semiconductor structure having a self-aligned channel stop, comprising:
   providing a first conductivity type semiconductor body having on the surface thereof an insulator layer;
   forming in said insulator layer an opening to expose said body corresponding to where a trench of a predetermined length is desired;
   forming a blockout layer having an opening therein to limit the exposure of said body exposed by said opening in said insulator layer to a selected portion of said length;
   introducing dopant of the first conductivity type into said body exposed by the resultant of the openings in said insulator and blockout layer;
   annealing to diffuse said dopant into said body; and
   reactively ion etching said body exposed by the opening in said insulator layer to form said trench whereby is formed a highly doped first conductivity type channel stop in a surface region of the semiconductor body abutting a portion of said trench.

2. The method as in claim 1 wherein said semiconductor body is monocrystalline silicon.

3. The method as in claim 2 wherein said insulator is composed of silicon dioxide and silicon nitride.

4. The method as in claim 3 wherein said dopant introduction is accomplished by ion implantation.

5. The method as in claim 3 wherein said dopant is of N conductivity type.

6. The method as in claim 2 further comprising etching said silicon body delineated by said trench to form a silicon mesa having at the upper peripheral sections thereof a channel stop.

7. The method as in claim 5 wherein said dopant is phosphorous.

8. The method as in claim 7 wherein the implantation energy and dose of said phosphorous ions are in the ranges of 30–180 Kev and $1-5 \times 10^{13}$ ions/sq.cm., respectively.

9. The method as in claim 1 wherein said dopant introduction comprises multiple ion implantation steps each involving a common dopant species, but different implantation energy and dose.

10. The method as in claim 3 wherein said blockout mask is composed of photoresist.

11. A method for forming a first conductivity type channel stop in a semiconductor body, comprising:
    providing a first conductivity type semiconductor body having on the surface thereof a insulative layer;
    forming on said layer a mask having an opening corresponding to the portion of said body where a device isolation trench of a given length is desired;
    etching selectively said insulative layer to form an opening in correspondence with said mask opening and exposing said body thereunder;
    removing said mask;
    forming a blockout layer on the resulting structure, said blockout layer having an opening corresponding to a portion of said body exposed by the opening in said insulative layer to limit exposure of said body exposed by the opening in said insulative layer to a portion of said length;
    implanting first conductivity type ions into said body exposed by the resultant of openings in said blockout and insulative layers;
    thermally annealing the structure resulting after removal of said blockout mask to diffuse the implanted ions into the semiconductor body; and
    etching said body exposed by said opening in the insulative layer to form said trench and thereby obtain a first conductivity type semiconductor mesa having at least one shallow, highly doped first conductivity type channel stop at a peripheral region thereof.

12. The method as in claim 11 wherein said blockout mask is photoresist.

13. The method as in claim 12 further comprising forming a pair of highly doped regions of a second conductivity type on the surface portion of said mesa on either side of and contiguous with said channel stop.

* * * * *

UNITED STATES PATENT AND TRADEMARK OFFICE
CERTIFICATE OF CORRECTION

PATENT NO. : 4,824,797

DATED : April 25, 1989

INVENTOR(S) : GEORGE R. GOTH

It is certified that error appears in the above-identified patent and that said Letters Patent is hereby corrected as shown below:

```
Column 4, line 12, change "caused to and" to read
--caused to laterally and--.
```

Signed and Sealed this

Twenty-eighth Day of November 1989

Attest:

JEFFREY M. SAMUELS

*Attesting Officer*  *Acting Commissioner of Patents and Trademarks*